United States Patent
Zhan et al.

(10) Patent No.: US 9,985,190 B2
(45) Date of Patent: May 29, 2018

(54) FORMATION AND STRUCTURE OF POST ENHANCED DIODES FOR ORIENTATION CONTROL

(71) Applicant: Sharp Laboratories of America, Inc., Camas, WA (US)

(72) Inventors: Changqing Zhan, Vancouver, WA (US); Mark Albert Crowder, Portland, OR (US); Paul John Schuele, Washougal, WA (US)

(73) Assignee: eLux Inc., Vancouver, WA (US)

( * ) Notice: Subject to any disclaimer, the term of this patent is extended or adjusted under 35 U.S.C. 154(b) by 0 days. days.

(21) Appl. No.: 15/158,556

(22) Filed: May 18, 2016

(65) Prior Publication Data

US 2017/0338389 A1    Nov. 23, 2017

(51) Int. Cl.
  H01L 21/00      (2006.01)
  H01L 33/62      (2010.01)
  H01L 33/06      (2010.01)

(52) U.S. Cl.
  CPC .............. H01L 33/62 (2013.01); H01L 33/06 (2013.01); *H01L 2933/0033* (2013.01); *H01L 2933/0066* (2013.01)

(58) Field of Classification Search
  CPC .......... H01L 33/06; H01L 33/42; H01L 33/62
  USPC ..................................................... 438/22–45
  See application file for complete search history.

(56) References Cited

U.S. PATENT DOCUMENTS

| | | | |
|---|---|---|---|
| 5,355,577 A | 10/1994 | Cohn | |
| 5,545,291 A | 8/1996 | Smith et al. | |
| 5,696,389 A | 10/1997 | Ishikawa et al. | |
| 5,821,169 A * | 10/1998 | Nguyen | G03F 7/00 216/41 |
| 5,904,545 A | 5/1999 | Smith et al. | |
| 5,942,446 A * | 8/1999 | Chen | H01L 21/31116 216/67 |
| 6,527,964 B1 | 3/2003 | Smith et al. | |
| 6,566,744 B2 | 5/2003 | Gengel | |
| 6,623,579 B1 | 9/2003 | Smith et al. | |
| 6,771,019 B1 | 8/2004 | Wu et al. | |
| 6,821,805 B1 | 11/2004 | Nakamura et al. | |
| 6,927,382 B2 | 8/2005 | King et al. | |
| 7,528,422 B2 | 5/2009 | Murphy | |
| 7,589,355 B2 | 9/2009 | Tomoda et al. | |
| 7,687,277 B2 | 3/2010 | Sharma et al. | |
| 7,727,788 B2 | 6/2010 | Han et al. | |

(Continued)

FOREIGN PATENT DOCUMENTS

| | | |
|---|---|---|
| JP | 2007-294566 | 11/2001 |
| JP | 2006-278511 | 10/2006 |
| JP | 11-186590 | 7/2007 |

OTHER PUBLICATIONS

Morris et al "Self-assembly for microscale and nanoscale packaging: steps toward self-packaging", IEEE Trans. Adv. Packag., 2005, 28, 600-611.

(Continued)

*Primary Examiner* — Whitney T Moore
*Assistant Examiner* — Herve Assouman
(74) *Attorney, Agent, or Firm* — Hamilton, Desanctis & Cha

(57) ABSTRACT

Embodiments are related to systems and methods for fluidic assembly, and more particularly to diodes offering orientation control properties in a fluidic assembly system.

36 Claims, 9 Drawing Sheets

(56) References Cited

U.S. PATENT DOCUMENTS

| | | | |
|---|---|---|---|
| 7,727,804 B2 | 6/2010 | Smith | |
| 7,874,474 B2 | 1/2011 | Kim et al. | |
| 7,928,655 B2 | 4/2011 | Lin et al. | |
| 7,931,063 B2 | 4/2011 | Craig et al. | |
| 8,076,178 B2 | 11/2011 | Krishnamoorthy et al. | |
| 8,318,595 B2 | 11/2012 | Morris et al. | |
| 8,426,227 B1 | 4/2013 | Bibi et al. | |
| 8,516,683 B2 | 8/2013 | Credelle et al. | |
| 8,552,436 B2 | 10/2013 | Bibl et al. | |
| 8,629,465 B2 | 1/2014 | Yu et al. | |
| 8,648,328 B2 | 2/2014 | Crowder et al. | |
| 8,685,774 B2 | 4/2014 | Crowder et al. | |
| 2002/0185648 A1* | 12/2002 | Furukawa | H01L 33/0079 257/79 |
| 2003/0057444 A1 | 3/2003 | Niki et al. | |
| 2005/0029533 A1* | 2/2005 | Wu | H01L 33/0095 257/99 |
| 2006/0278886 A1* | 12/2006 | Tomoda | H01L 33/20 257/99 |
| 2007/0031992 A1 | 2/2007 | Schatz | |
| 2007/0090377 A1* | 4/2007 | Lin | H01L 27/153 257/94 |
| 2007/0120463 A1 | 5/2007 | Hayashi et al. | |
| 2007/0224713 A1 | 9/2007 | Han et al. | |
| 2008/0036038 A1 | 2/2008 | Hersee et al. | |
| 2008/0151952 A1* | 6/2008 | Takatani | B82Y 20/00 372/36 |
| 2010/0012968 A1* | 1/2010 | Yahata | H01L 33/58 257/99 |
| 2010/0163895 A1 | 7/2010 | Horie | |
| 2010/0276664 A1 | 11/2010 | Hersee | |
| 2011/0031516 A1 | 2/2011 | Basin et al. | |
| 2012/0187412 A1* | 7/2012 | D'Evelyn | H01L 29/02 257/76 |
| 2012/0193670 A1* | 8/2012 | Son | H01L 33/504 257/99 |
| 2012/0256187 A1* | 10/2012 | Yu | H01L 27/153 257/76 |
| 2012/0273823 A1* | 11/2012 | Yoneda | H01L 33/38 257/98 |
| 2013/0161584 A1 | 6/2013 | Crowder et al. | |
| 2013/0161643 A1 | 6/2013 | Crowder et al. | |
| 2013/0292718 A1* | 11/2013 | Chu | H01L 27/153 257/93 |
| 2014/0008696 A1 | 1/2014 | Kim et al. | |
| 2014/0077158 A1 | 3/2014 | Crowder et al. | |
| 2014/0175485 A1* | 6/2014 | Liao | H01L 33/44 257/98 |
| 2014/0355931 A1 | 12/2014 | Tummala et al. | |
| 2015/0060402 A1 | 5/2015 | Moslehi et al. | |
| 2015/0140721 A1 | 5/2015 | Moslehi et al. | |
| 2015/0155445 A1 | 6/2015 | Zhan et al. | |
| 2015/0166396 A1 | 6/2015 | Marjanovic et al. | |
| 2015/0214430 A1 | 7/2015 | Zhan et al. | |

OTHER PUBLICATIONS

Boncheva "Millimeter-scale self-assembly and its applications", Pure Appl. Chem., 75, No. 5, pp. 621-630, 2003.

Mastrangeli et al "Self-assembly from milli- to nanoscales methods and applications" J. Micromech. Microeng., 2009,19, 083001, (37 PP).

Yeh "Fluidic self-assembly for the integration of GaAs light-emitting diodes on Si substrates", IEEE Photonics Technol. Lett., 1994, 6, 706-708.

Tien "Microfabrication through electrostatic self-assembly", Langmuir, 1997, 13, 5349-5355.

Snyder et al "Fluidic self-assembly of semiconductor devices: a promising new method of mass-producing flexible circuitry", Jpn. J. Appl. Phys., 2002,41,4366-4369.

Chung,Programmable reconfigurable self-assembly: parallel heterogeneous integration of chip-scale components on planar and nonplanar surfaces, J. Microelectromech. Syst., 2006.

Stauth "Self-assembled single-crystal silicon circuits on plastic", Proc. Natl. Acad. Sci, U. S. A., 2006, 103, 13922-13927.

Saeedi et al "Self-assembled single-digit micro-display on plastic", Proc. of SPIE, 2008, 6885, 688509.

Park "Orientation-specific self-assembly at air-water interface using magnetic field", Transducers'11, Beijing, China, Jun. 5-9, 2011, 866-869.

Tkachenko "Evaluation of directed self-assembly process for LED assembly on flexible substrates", Electronic Components & Technology Conference (ECTC), 2013 IEEE 63rd.

Nakagawa "Controlled deposition of silicon nanowires on chemically patterned substrate by capillary force using a blade-coating method", J. Phys. Chem. C, 2008,112, 5390-5396.

Arase, "Interfacial-energy-controlled deposition technique of microstructures using blade-coating", J. Phys. Chem. B, 2009, 113, 15278-15283.

Nakagawa "Interfacial-force-controlled placing technique of microstructures of sub- to one hundred micrometer size using blade coating", Jpn. J. Appl. Phys., 2011, 50, 01BJ09.

Arase, "Fluidic self-assembly of microstructures using a blade-coating technique" Jpn J. Appl. Phys., 2012, 51, 036501.

Nordquist et al., "An Electro-Fluidic Assembly Technique for Integration of III-V Devices onto Silicon" IEEE International Symposium on Compound Semiconductors, Proc. 2000.

Khare et al "Via Hole Formation in Semi-Insulating InP Using Wet Photoelectrochemical Etching" Indium Phosphide and Related Materials, 1993. Conference proceedings.

Brusberg et al, "Thin Glass Based Packaging Technologies for Optoelectronic Modules" Electronic Components and Technology Conference, 2009.

Kim et al Large Scale Self-assembly of crystalline semiconductor microsomponents onto plastic substrates via microfluidic traps 4th IEEE Conf. on Automation (2008).

Xiao et al "Fluidic assisted thin-film device heterogeneous integration: surface tension as driving force and magnetic as guiding force" Science Direct (2015).

Yeh et al, "New fabrication technique for the integration of large area optoelectronic display panels" OSA/CLEO (1994).

Varna et al "Fluidic self-assembly of silicon microstructures" University of CA Berkley (1995).

Talghader "Integration of LEDs and VCSELs using fluidic self-assembly (SPIE vol. 3286, p. 86).

Zheng et al, "Self-assembly process to integrate and connect semiconductor dies on surfaces with single-angular orientation and contact pad registration" Adv. Mater. (2006,18).

Park et al "A First Implementation of an Automated Reel-to-Reel Fluidic Self-Assembly Machine" Adv. Mater. vol. 26, No. 34, Sep. 14 Available online Jun. 2014.

Park et al "Printed Assemblies of Inorganic Light-Emitting Diodes for Deformable and Semitransparent Displays" Aug. 2009 www.Sciencemag.org.

Jacobs et al "Fabrication of a Cylindrical Display by Patterned Assembly" Science, vol. 296, Apr. 2002.

Chung et al "Guided and Fluidic Self-Assembly or Microstructures Using Railed Microfluldic channels" Pub. online May 15, 2003.

* cited by examiner

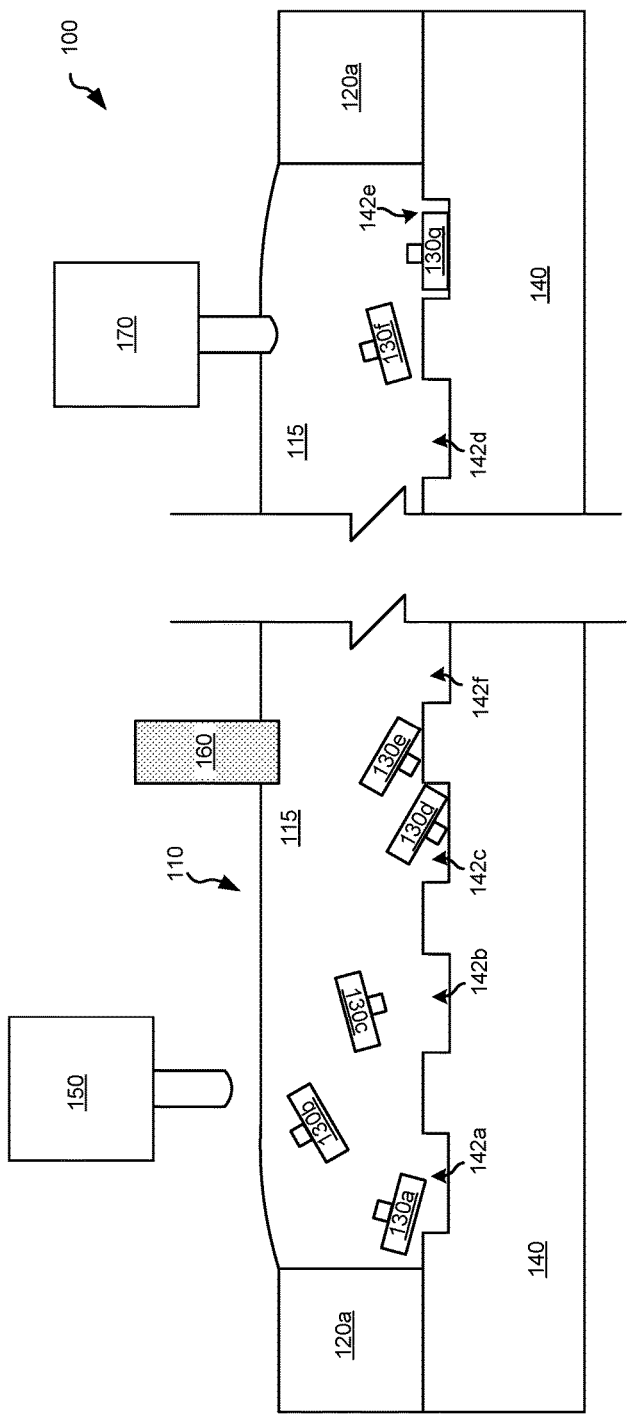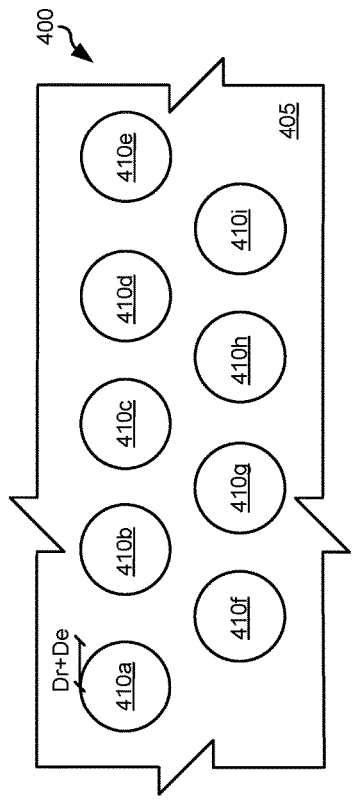

FORMATION AND STRUCTURE OF POST ENHANCED DIODES FOR ORIENTATION CONTROL

FIELD OF THE INVENTION

Embodiments are related to systems and methods for fluidic assembly, and more particularly to diodes offering orientation control properties in a fluidic assembly system.

BACKGROUND

LED displays, LED display components, and arrayed LED devices include a large number of diodes formed or placed at defined locations across the surface of the display or device. Forming or placing such a large number of diodes often results in low throughput or in a number of defects which reduce the yield of a display or device manufacturing process. Some approaches to increasing throughput and yield include adding additional diodes per pixel to provide enough redundancy to ensure that at least a sufficient number of diodes per pixel are properly formed. This type of approach offers enhanced yield, but without adding a large number of redundant diodes per pixel, display yields are often still lower than desired. Any yield less than one hundred percent within a display is costly both in an impact on profits and an impact on manufacturing throughput.

Hence, for at least the aforementioned reasons, there exists a need in the art for advanced systems and methods for manufacturing LED displays, LED display components, and LED devices.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts a fluidic assembly system capable of moving a suspension composed of a carrier liquid and a plurality of post enhanced diodes relative to the surface of a substrate in accordance with one or more embodiments of the present inventions;

FIG. 4 shows a portion of a display including a number of wells into which post enhanced diodes may be deposited in accordance with various embodiments of the present inventions;

DETAILED DESCRIPTION OF SOME EMBODIMENTS

Figure 2A:
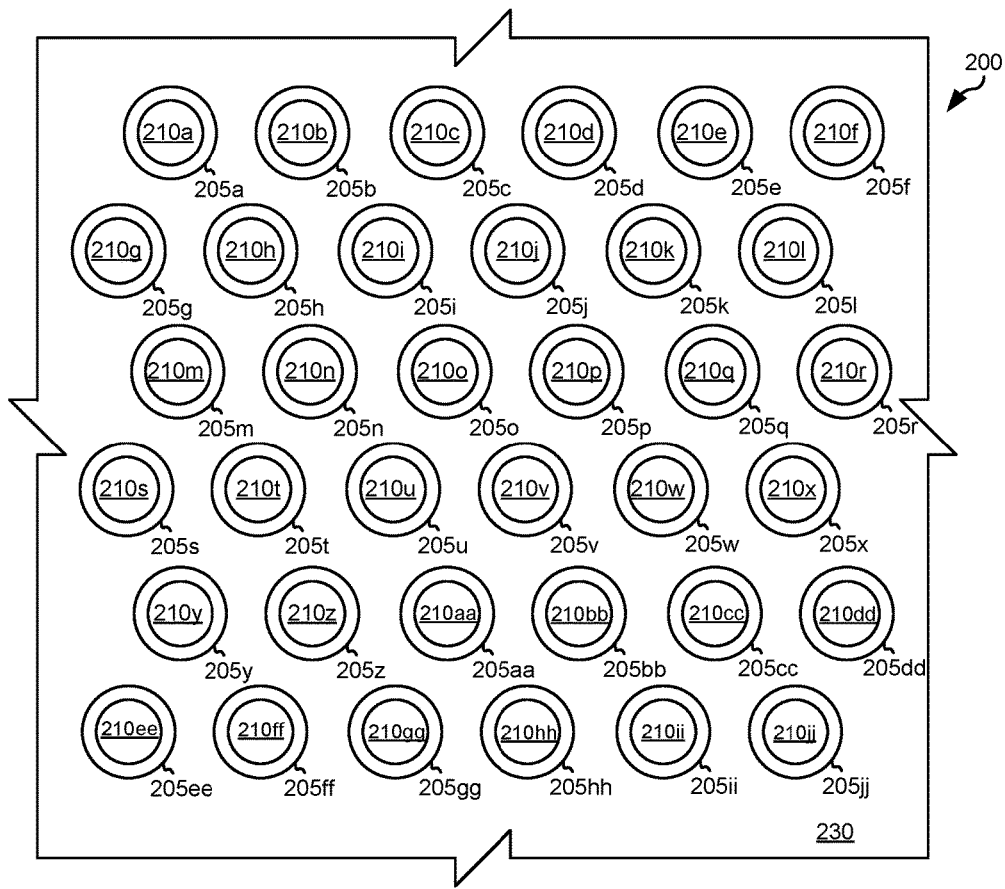
FIGS. 2a-2e show a portion of a display including a substrate having a number of wells each filled with a respective post enhanced diode in accordance with embodiments of the present inventions.

Embodiments are related to systems and methods for fluidic assembly, and more particularly to diodes offering orientation control properties in a fluidic assembly system.

Various embodiments provide methods for manufacturing a post enhanced diode. The methods include: providing a diode stack structure including an n-doped semiconductor layer and a p-doped semiconductor layer, and forming a post disposed over the diode stack structure. In some instances, the methods further include forming a current spreading layer on the diode stack structure such that the current spreading layer is between the post and the diode stack structure. In some such instances, forming the post includes: depositing conductive post material overlying the current spreading layer, and forming the post as an electrical contact for the post enhanced diode. In other such instances, forming the post includes: selectively plating a conductive metal post material overlying the current spreading layer, and forming the post as an electrical contact for the post enhanced diode.

In various instances of the aforementioned embodiments, the diode stack structure is a light emitting diode stack structure having a quantum well disposed between the n-doped semiconductor layer and the p-doped semiconductor layer. In some instances of the aforementioned embodiments, forming the post disposed over the diode stack structure includes: forming a post material disposed over the diode stack structure where a thickness of the post material defines a height of the post; forming a hard mask disposed over the post material to define a width of the post; and etching the post material using the hard mask as a guide to define the post. In some such instances, the post is made of Silicon Dioxide, and the hard mask is made of amorphous Silicon. In various of such instances, forming the hard mask includes: conformally depositing an etch stop layer overlying the post material; conformally depositing a hard mask layer over the etch stop layer; conformally depositing a masking layer overlying the hard mask layer; patterning the masking layer to define a post shape and exposing regions of the hard mask; etching the hard mask layer to expose regions of the etch stop; and etching the etch stop to expose regions of the post material.

In various instances of the aforementioned embodiments where the previously discussed hard mask is a first hard mask, forming the post disposed over the diode stack structure further includes: forming a second hard mask encasing the post, where the second hard mask defines a width of a diode structure; and etching the diode stack structure using the second hard mask as a guide to define the diode structure. In some such instances, the post is made of a first material, the first hard mask is made of a second material, and the second hard mask is made of the first material. In one or more instances of the aforementioned embodiments, the etch stop layer is a first etch stop layer, the hard mask layer is a first hard mask layer, the masking layer is a first masking layer, the method further includes forming a current spreading layer on the diode stack structure where the current spreading layer is between the post and the diode stack structure; and forming the second hard mask encasing the post includes: conformally depositing a second hard mask layer overlying the post and a portion of a top surface of the current spreading layer; conformally depositing a second masking layer overlying the second hard mask layer; patterning the second masking layer to define a shape of the diode structure; etching the second hard mask layer, the current spreading layer, and the diode stack structure;

removing the second hard mask and the first hard mask to yield expose the post enhanced diode.

In one or more instances of the aforementioned embodiments, the diode stack structure is attached to a substrate, and the methods further include separating the post enhanced diode from the substrate. In some such instances, the methods further include forming at least one electrical contact on an exposed portion of the current spreading layer prior to separating the post enhanced diode from the substrate. In some instances of the aforementioned embodiments, the first hard mask and the second hard mask are made of one of tetraethyl orthosilicate (TEOS), nickel, or chrome; the first etch stop material is amorphous silicon, and the post material is one of a dielectric film, TEOS, conductive metal, or silicon dioxide.

In various instances of the aforementioned embodiments, the shape of the diode structure is one of a circle, or a polygon. In some cases, a bottom layer of the diode stack structure opposite a top layer over which the post is disposed operates as an electrical contact. In one or more embodiments, the diode stack structure is formed on top of a substrate, and the methods further include: forming a hard mask layer over a top surface of the diode stack structure; conformally depositing a masking layer overlying the hard mask layer; patterning the masking layer into plate shapes; etching regions exposed by the hard mask layer down to form a diode structure attached to the substrate; and removing the hard mask layer. In some instances where the hard mask layer is a first hard mask layer and the masking layer is a first masking layer, forming the post disposed over the diode stack structure includes: subsequent to forming the diode structure, depositing a post material; conformally depositing a second etch stop layer overlying a top surface of the diode structure; conformally depositing a second hard mask layer overlying the second etch stop layer; conformally depositing a third masking layer overlying the second hard mask layer; patterning the third masking layer to define a post shape; etching exposed regions of the third hard mask layer; etching exposed regions of the second etch stop layer to form the post; and subsequent to forming the post, separating the post enhanced diode from the substrate. In some instances, the methods further include forming at least one electrical contact on a top surface of the diode structure prior to separating the post enhanced diode from the substrate. In one or more instances, forming a hard mask layer over a top surface of the diode stack structure includes forming the hard mask layer on a current spreading layer disposed over the top surface of the diode stack structure. The methods may further include: depositing a conductive metal post material; and forming the post as an electrical contact for the post enhanced diode.

Other embodiments provide methods for manufacturing a post enhanced diode that include: providing a diode stack structure including an n-doped semiconductor layer and a p-doped semiconductor layer; patterning and etching the diode stack structure to yield a diode structure; and forming a post disposed over the diode structure, where the post is formed subsequent to patterning and etching the diode stack structure. Yet other embodiments provide for manufacturing a post enhanced diode that include: providing a diode stack structure including an n-doped semiconductor layer and a p-doped semiconductor layer; patterning and etching the diode stack structure to yield a diode structure; and forming a post disposed over the diode structure, where the post is formed before patterning and etching the diode stack structure Turning to FIG. 1, a fluidic assembly system 100 capable of moving a suspension 110 composed of a carrier liquid 115 and a plurality of post enhanced diodes 130 relative to the surface of a substrate 140 is shown in accordance with one or more embodiments of the present inventions. In some embodiments, substrate 140 is formed of a polymer material laminated to the surface of a glass substrate. In particular embodiments, wells 142 are etched or otherwise formed in the laminate layer. As used herein, the term "well" is used in its broadest sense to mean any surface feature into which a post enhanced diode may be deposited. In other embodiments, the substrate is made of glass with wells 142 directly formed into the glass. Wells 142 may have flat and vertical surfaces as shown, or they may have bottoms and sides with complex curvatures. Based upon the disclosure provided herein, one of ordinary skill in the art will recognize a variety of materials, processes, and/or structures that may be used to form substrate 140. For example, substrate 140 can be formed of any material or composition compatible with fluidic device processing. This can include, but is not limited to, glass, glass ceramic, ceramic, polymer, metal, or other organic or inorganic materials. As examples, wells 142 can be defined in a single material forming a surface feature layer when applied to the surface of a base glass sheet. It is also possible for patterned conductor layers to exist between wells 142 formed in such a surface feature layer and the base glass layer. Substrate 140 can also be made of multiple layers or combinations of these materials. Substrate 140 may be a flat, curved, rigid, or flexible structure. In some cases, substrate 140 may end up being the final device substrate or it may only serve as an assembly substrate to position post enhanced diodes 130. In the case of an assembly substrate, post enhanced diodes 130 would then be transferred to the final device substrate in subsequent steps.

In some embodiments, carrier liquid 115 is isopropanol. Based upon the disclosure provided herein, one of ordinary skill in the art will recognize a variety of liquids, gasses, and/or liquid and gas combinations that may be used as the carrier liquid. It should be noted that various analysis provided herein is based upon flow in a single, continuous direction or in other cases a relatively simple back-forth motion, but that the flow may be more complex where both the direction and magnitude of fluid velocity can vary over time.

As shown in FIG. 1, post enhanced diodes 130 each include a relatively large diode structure and a smaller post extending from a top surface of the diode structure, and wells 142 in substrate 140 are each capable of receiving a given post enhanced diode 130 in a non-inverted orientation. As used herein, the phrase "post enhanced diode" is used broadly to mean any device with a post extending from a surface of either an anode or cathode of a diode structure such that at least a portion of an outer edge of the post is set back from an edge of the diode structure. As used herein the phrase "non-inverted orientation" is used in its broadest sense to mean any orientation of a post enhanced diode 130 with the post extending generally away from the top surface of substrate 140 (i.e., away from the bottom of wells 142); and as used herein the phrase "inverted orientation" is used in its broadest sense to mean any orientation of a post enhanced diode 130 with the post extending generally toward the top surface of substrate 140 (i.e., toward from the bottom of wells 142). Using these definitions, post enhanced diodes 130a, 130b, 130f, and 130g are each in a non-inverted orientation; and post enhanced diodes 130c, 130d, and 130e are each in an inverted orientation. The diode structure and post of post enhanced diodes 130 are discussed in greater detail below in relation to FIGS. 2a-2e. It should be noted that in some cases the diode structure including an anode on one side and a cathode on the other can be referred to as asymmetric due to the different materials on each side of the diode structure, however, the use of the term "asymmetric" in relation to a diode herein refers to any asymmetry of forces generated by liquid movement around a post enhanced diode between an inverted orientation and a non-inverted orientation due to a post extending from the diode structure. In some cases, the depth of wells 142 is substantially equal to the height of the diode structure of each of the post enhanced diodes 130, and the inlet opening of wells 142 is greater that the width of the diode structure of each of the post enhanced diodes 130 such that only one post enhanced diode 130 deposits into any given well 142. It should be noted that while embodiments discuss post enhanced diodes that include a single post extending from a diode structure, that various embodiments provide post enhanced diodes that each include two or more posts each extending from the same diode structure.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that post enhanced diodes 130 move relative to the surface of substrate 140. As post enhanced diodes 130 move relative to the surface of substrate 140 they deposit into wells 142 in either a non-inverted orientation or an inverted orientation. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

When deposited in the inverted orientation (e.g., post enhanced diode 130d), the movement generated by suspension movement device 160 generates force likely to dislocate an inverted post enhanced diode 130 from a given well 142. In contrast, when deposited in the non-inverted orientation (e.g., post enhanced diode 130g), the force on the deposited, non-inverted post enhanced diode 130 caused by suspension movement device 160 is unlikely to dislocate the post enhanced diode from a given well 142. In some embodiments, the likelihood of dislocating an inverted post enhanced diode 130 from a well 142 is much greater than the likelihood of dislocating a non-inverted post enhanced diode 130 from a well 142. In some embodiments the moment of force required to dislocate an inverted post enhanced diode 130 from a well 142 is between $0.01 \times 10^{-14}$ N-m and $1.0 \times 10^{-14}$ N-m depending upon the width to height ratio of the post and the diameter of the diode structure (where a positive value of the moment of force indicates the diode structure of a post enhanced diode 130 is being forced to rotate about a point of rotation); and the moment of force required to dislocate a non-inverted post enhanced diode 130 from a well 142 is a negative value (where a negative value of the moment of force indicates the diode structure of a post enhanced diode 130 is being pushed down on the surface of substrate 140) for the same width to height ratio of the post and thickness of the diode structure making any displacement unlikely. As used herein, a post enhanced diode is considered "likely to dislocate" where the moment of force is a positive value, and is considered "unlikely to dislocate" where the moment of force is a negative value.

Similarly, when moving across the surface of substrate 140 in the inverted orientation (e.g., post enhanced diode 130e), the movement generated by suspension movement device 160 generates a force likely to flip an inverted post enhanced diode 130. In contrast, when moving across the surface of substrate 140 in the non-inverted orientation (e.g., post enhanced diode 130f), the force on the non-inverted post enhanced diode 130 caused by suspension movement device 160 is less likely to flip the post enhanced diode. In some embodiments, the likelihood of flipping an inverted post enhanced diode 130 moving near the surface of substrate 140 is greater than the likelihood of flipping a non-inverted post enhanced diode 130 moving similarly near the surface of substrate 140 as the moment of force for the inverted post enhanced diode 130 is greater than the moment of force for the non-inverted post enhanced diode 130.

A capture device 170 includes an inlet extending into suspension 110 and capable of recovering a portion of suspension 110 including a portion of carrier liquid 115 and non-deposited post enhanced diodes 130, and returning the recovered material for reuse. In some embodiments, capture device 170 is a pump.

Turning to FIG. 2a, a top view 200 of a substrate portion 230 is shown including a number of wells 205 into which post enhanced diodes 210 have been successfully deposited. Each of post enhanced diodes 210 of FIG. 2a are represented in a top view 235 of FIG. 2b, a cross sectional view 250 of FIG. 2c, and a circuit symbol 280 of a post enhanced diode 210 operating as an LED. Post enhanced diodes 210 include one or more features that enable the relative flow of a carrier liquid about post enhanced diodes 210 to create a net moment of force for increasing a likelihood of flipping post enhanced diodes 210 from a first orientation to a second orientation, with a dissimilar (i.e., asymmetric) likelihood of flipping post enhanced diodes 210 from the second orientation to the first orientation. These features may include sidewall angles, surface structures such as posts, or the general shape of the post enhanced diodes 210. Notably, the aforementioned structures and shapes of the post enhanced diodes 210 that encourage asymmetric re-orientation may or may not be present in a final display incorporating post enhanced diodes 210.

Figure 2B:
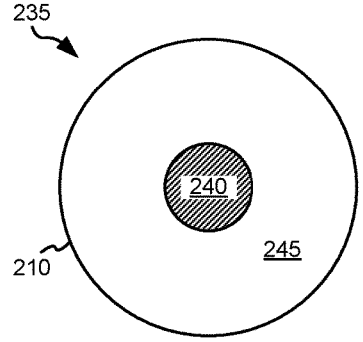
Figure 2C:
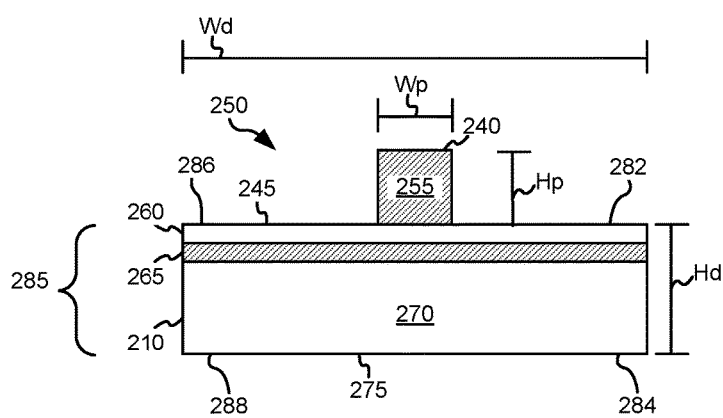
Figure 2D:
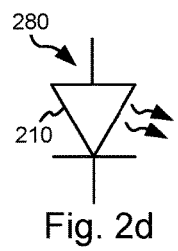

As shown in FIGS. 2b-2c, post enhanced diode 210 includes a planar top surface 245 of an electrically conductive material 260 (shown as an un-patterned region). As used herein, the term "planar" is used in its broadest sense to mean two dimensional with exception of defects or process related variance standard in semiconductor manufacturing processes. In some embodiments, electrically conductive material 260 is p-doped Gallium Nitride (GaN). A post 255 (show as a hatched pattern region) extending from top surface 245 is also shown. A top surface 240 of post 255 is also shown. In some embodiments, post 255 is formed of electrically conductive material 260 (i.e., a homogeneous post). In other embodiments, post 255 is formed of a material other than electrically conductive material 260 (i.e., a heterogeneous post). In some cases, a heterogeneous post is formed at least in part of an insulating layer such as $SiO_2$, and in other cases a heterogeneous post is formed of a conductive material such as a metal compatible with deposition on electrically conductive material 260. It should be noted that while post 255 is shown as substantially centered on top surface 245, in other embodiments post 255 may be offset from a center position at any location from a center point of top surface 245 to a radial distance from the center point such that a portion, but not all of the edges, of post 255 is coextensive with an edge of a diode structure 285. In some cases the post can have a rounded top surface or surface with complex curvature, and in other cases it can have a substantially flat top surface. In other cases, multiple posts may exist on the diode top surface.

Various approaches may be used for forming post 255 on diode structure 285. For example, fabricating a homogeneous post may include etching the top surface of a thick layer of electrically conductive material 260 to yield the combination of both post 255 and the layer of electrically conductive material 260 shown in cross sectional view 250; or by forming the layer of electrically conductive material 260 followed by selective epitaxial growth using the same material to form post 255. As other examples, fabricating a heterogeneous post may include etching the post from a film that is deposited onto top surface 245 of diode structure 285, or by forming a post with a different material through plating or a templated growth process on top of top surface 245 of diode structure 285. This latter approach permits the use of any material for the post (e.g., dielectrics, metals, etc.). In some cases, photolithography of a photoresist may be used in relation to the aforementioned plating or template growth.

Top surface 245 includes one or more electrical contacts 282, 286 that conduct charge from a signal source (not shown) to electrically conductive material 260. In some embodiments, electrical contacts 282, 286 are formed of a metal deposited onto the layer of electrically conductive material 260. In other embodiments, electrical contacts 282, 286 are an exposed area of top surface 245 to which a signal source (not shown) can contact electrically conductive material 260. In some embodiments where post 255 is formed of a conductive material it operates as a post. In one particular embodiment where post 255 is formed of electrically conductive material 260, an exposed area of top surface 240 to which a signal source (not shown) can contact electrically conductive material 260 operates as an electrical contact.

The layer of electrically conductive material 260 is disposed on top of a multiple quantum well (MQW) 265 (shown as a hatched pattern region), which in turn is disposed on top of a layer of an electrically conductive material 270 (shown as an un-patterned region). In some embodiments, electrically conductive material 270 is n-doped Gallium Nitride (GaN). MQW 265 may be formed of any material compatible with both electrically conductive material 260 and electrically conductive material 270, and which when sandwiched between electrically conductive material 260 and electrically conductive material 270 is capable of operating as a light emitting diode (LED). Together, the layer of electrically conductive material 260, MQW 265, and the layer of electrically conductive material 270 form a diode structure of post enhanced diodes 210. Based upon the disclosure provided herein, one of ordinary skill in the art will recognize a variety of materials and material combinations that may be used in forming diode structure 285 of a given post enhanced diode 210. As different post enhanced diodes 210 are intended to emit light of different wavelengths (e.g., red, green, blue), the construction and/or materials for different instances of post enhanced diodes 210 will vary to achieve a desired color distribution.

The layer of electrically conductive material 270 includes a planar bottom surface 275. Bottom surface 275 includes one or more electrical contacts 284, 288 that conduct charge from a signal source (not shown) to electrically conductive material 270. In some embodiments, electrical contacts 284, 288 are formed of a metal deposited onto the layer of electrically conductive material 270. In other embodiments, electrical contacts 284, 288 are an exposed area of bottom surface 275 to which a signal source (not shown) can contact electrically conductive material 270. In particular cases, electrical contacts 284, 288 are two sides of the same contact extending as a concentric circle of exposed electrically conductive material 270 around the perimeter of bottom surface 275.

Post 255 has a width (Wp) and a height (Hp), and diode structure 285 has a width (Wd) and a height (Hd). As more fully discussed below in relation to FIG. 2e, the sides of post 255 and diode structure 285 in some cases are not perfectly vertical and may vary. In such a case, the aforementioned width and height characteristics of post 255 and diode structure 285 are considered to be: the maximum width where the width varies as a function of height, and the maximum height where the height varies as a function of width. In some embodiments, the width:height ratio of diode structure 285 (i.e., Wd:Hd) is between 5:1 and 50:1. In some particular embodiments, the width:height ratio of diode structure 285 (i.e., Wd:Hd) is between 5:1 and 30:1. In some embodiments, the width:height ratio of post 255 (i.e., Wp:Hp) is between 2:1 and 5:1. In various embodiments, the height of diode structure 285 (i.e., Hd) is between 4 μm and 7 μm, and the height of post 255 (i.e., Hp) is between 2 μm and 7 μm, in part depending upon the desired ratio of Hd to Hp.

The dimensions of post 255 can affect the stability of an inverted post enhanced diode 210. In particular, if the post is too small, post enhanced diode 210 will not be as likely to flip into a non-inverted orientation. Numerical modeling of the fluidic process shows that, for a 50-μm-diameter (Wd) diode structure that is 5 μm thick (Hd) exposed to a flow velocity of a carrier liquid of 4.6 mm/s, a post with dimensions of 10 μm×5 μm (Wp×Hp) will flip the disk to the non-inverted orientation. Models with varying post dimensions on a 50-μm-diameter (Wd) disk diode structure that are captured in a 3 μm deep well have shown that small posts (e.g., with a height (Hp) less than or equal to 4 μm) exposed to a similar flow velocity as above, have little influence on the orientation, but a 5-μm high (Hp) post is sufficient to cause an inverted post enhanced diode 210 to flip while a non-inverted post enhanced diode 210 will remain in a non-inverted orientation. Experimental data has demonstrated that the modeling revealing the aforementioned dimensions is reliable, and that a post with dimensions of 12 μm×3 μm (Wp×Hp) is able to influence the orientation of fluidically-aligned disks, with a yield of over 99.7% of disks (out of 150 disks) having a desired non-inverted orientation.

Figure 2E:
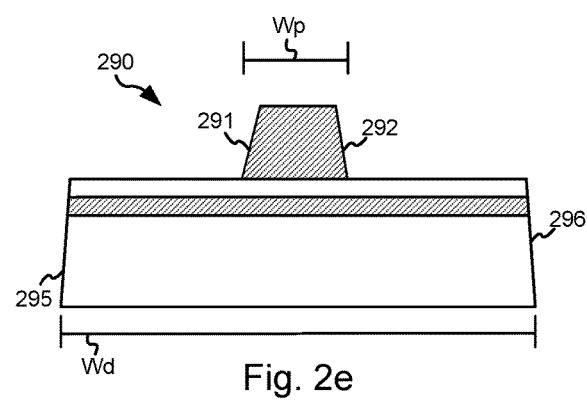

Turning to FIG. 2e, a cross sectional view 290 of another embodiment of a post enhanced diode 210 where side walls 291, 292 of post 255 and sidewalls 295, 296 of diode structure 285 each exhibit a tapered slope compared with the vertical slope shown in cross sectional view 250 of FIG. 2c. As discussed above, where the sidewalls are tapered (i.e., vary as a function of height), the width of the post (Wp) is the maximum width thereof, and the width of diode structure 285 (Wd) is the maximum width thereof as shown in cross sectional view 290. The taper exhibited by the sidewalls will vary dependent upon the processes and materials used for constructing post enhanced diodes 130 as is known in the art. Similar tapering may occur on the sides of wells 205. It should be noted that addition of the post to diode structure 285 results an asymmetry of forces generated by liquid movement around a plate diode between an inverted orientation and a non-inverted orientation. As such, the post need not be a perfectly vertical structure, but rather may be any structure sufficient to result in a net positive moment of force when post enhanced diode 210 is in an inverted orientation, and a substantially lower moment of force when post enhanced diode 210 is in a non-inverted orientation such that post enhanced diodes 210 will prefer a non-inverted orientation. In some cases, the depth of wells 205 is substantially equal to the height of diode structure 285 of each of the post enhanced diodes 210, and the inlet opening of wells 205 is greater that the width of diode structure 285 of each of the post enhanced diodes 210 such that only one post enhanced diode 210 deposits into any given well 205.

Once post enhanced diodes 210 are deposited in wells 205 with post 255 extending away from substrate portion 230, one or more electrical contacts in wells 205 are connected to one or more electrical contacts on bottom surface 275 of post enhanced diodes 210, and one or more processing steps are performed to electrically connect one or more electrical contacts on top surface 245 of post enhanced diodes 210 to controllable signals. Upon completion of such processing, post enhanced diodes 210 can be individually controlled causing a display including substrate portion 230 and post enhanced diodes 210 to display a desired image. Post enhanced diodes 210 as discussed herein may be used, among other things, to fabricate both direct emission displays and locally-addressed backlight units.

Figure 3A:
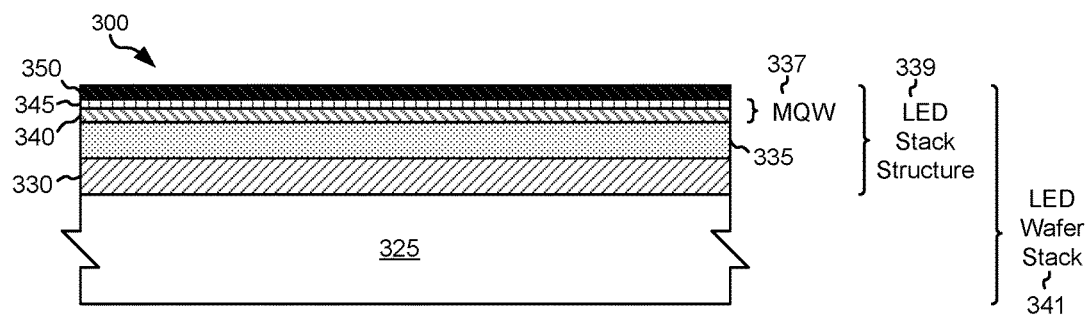
FIGS. 3a-3m show various processes utilized in manufacturing post enhanced diode in accordance with some embodiments of the present inventions.

Turning to FIG. 3a, a cross sectional view 300 of an LED wafer stack 341 is shown in accordance with some embodiments. As shown, LED wafer stack 341 includes an LED stack structure 339 that is formed on top of a substrate 325. In some embodiments, substrate 325 is a sapphire ($Al_2O_3$) material. Based upon the disclosure provided herein, one of ordinary skill in the art will recognize other materials that may be used for substrate 325 including, but not limited to, silicon. LED stack structure 339 includes a first layer 330 disposed on substrate 325, a second layer 335 disposed on first layer 330, an MQW 337 disposed on second layer 335, and a third layer 350 disposed on MQW 337. The bottom layer of LED stack structure 339 may operate as an electrical contact, or may later be processed to form an electrical contact on the bottom layer.

In the case of a blue LED, first layer 330 is undoped Gallium Nitride (u-GaN), and second layer 335 is n-doped GaN (n-GaN). MQW 337 includes: a section 340 of alternating layers of Indium Gallium Nitride (InGaN) and GaN, and a transition layer 345 of p-doped Aluminum Gallium Nitride (p-AlGaN). Third layer is p-doped GaN (p-GaN). In one particular embodiment, substrate 325 is approximately 430 μm thick, first layer 330 is approximately 2 μm thick, second layer 335 is approximately 2.5 μm thick, section 340 is approximately 0.2 μm thick, transition layer 345 is approximately 0.08 μm thick, and third layer 350 is approximately 0.2 μm thick. Based upon the disclosure provided herein, one of ordinary skill in the art will recognize other materials and thicknesses that may be used in relation to the different layers of LED wafer stack 341 to create different types of light emitting diodes.

Figure 3B:
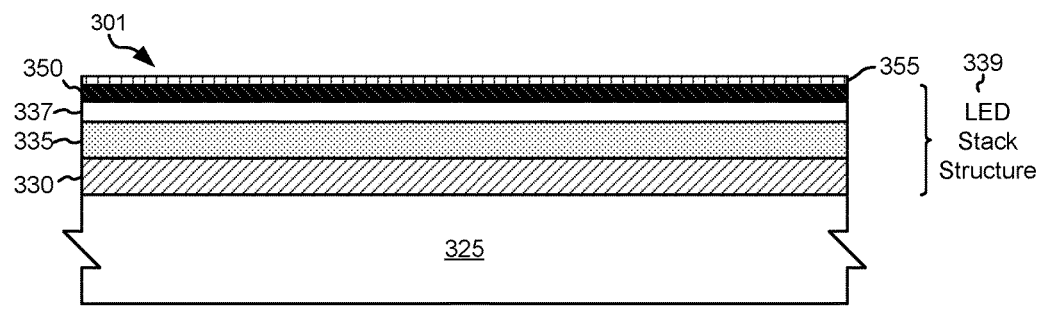

Turning to FIG. 3b, a cross sectional view 301 of LED wafer stack 341 of FIG. 3a augmented to include a current spreading layer 355 disposed on top of third layer 350. In one embodiment where third layer 350 is p-GaN, current spreading layer 355 is a stack of nickel oxide and Indium-Tin-Oxide (ITO) with a thickness between 20 nm and 100 nm. In some embodiments, current spreading layer 355 is formed on top of LED wafer stack 341 using a sputtering process. In other embodiments, current spreading layer 355 is formed on top of LED wafer stack 341 using a pyrolysis process. Based upon the disclosure provided herein, one of ordinary skill in the art will recognize other processes that may be used to form current spreading layer 355.

Figure 3C:
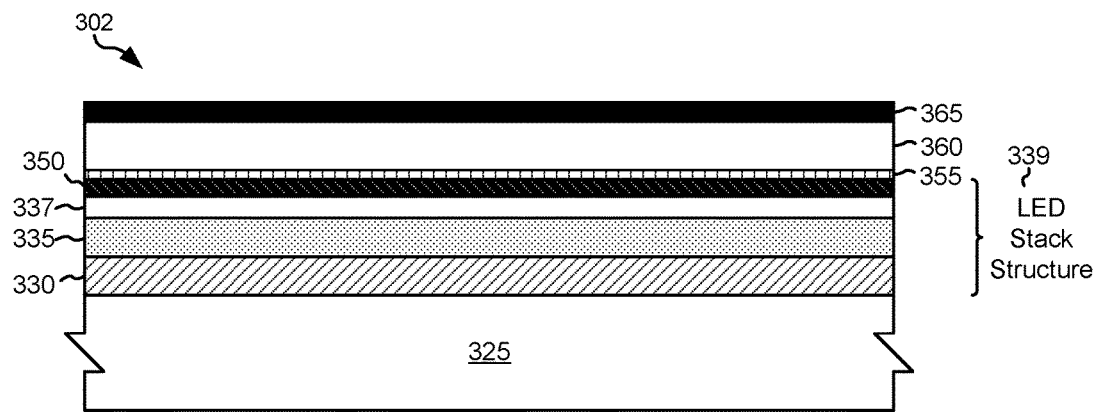

Turning to FIG. 3c, a cross sectional view 302 of LED wafer stack 341 of FIG. 3a augmented with current spreading layer 355 that is further augmented to include a post layer 360 disposed on top of current spreading layer 355, and a hard mask layer 365 disposed on top of post layer 360. The thickness of post layer 360 is varied depending upon the height of the post to be formed on top of the diode structure (e.g., the height of post 255 (Hp) formed on top of diode structure 285). Post layer 360 may be a thick film such as, for example, $SiO_2$. In some embodiments, post layer 360 may be formed using a chemical vapor deposition (CVD) process. In particular embodiments, post layer 360 is formed on top of current spreading layer 355 using a plasma enhanced CVD (PECVD). Based upon the disclosure provided herein, one of ordinary skill in the art will recognize other processes that may be used to form post layer 360. As just one example, where a post that is to be, for example, 3 μm thick on top of a diode structure that is approximately 5 μm thick, post layer 360 is formed to be 3 μm thick.

Figure 3D:
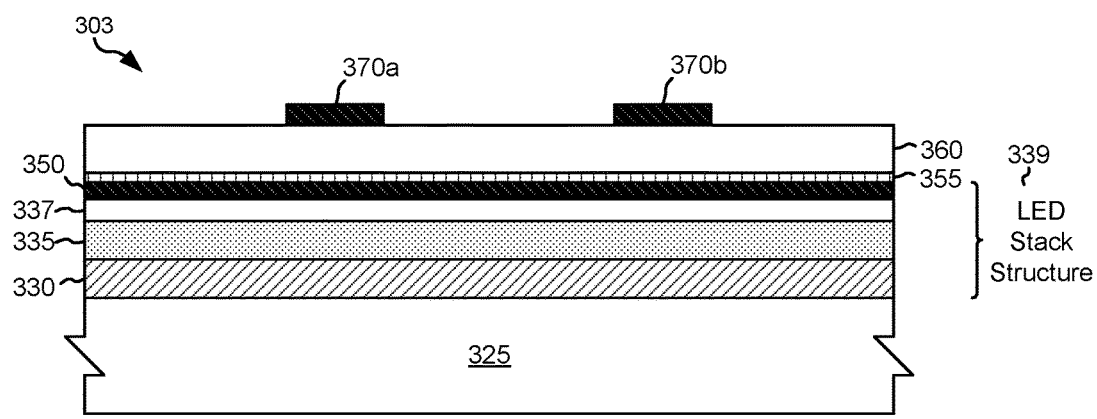

Hard mask layer 365 may be formed of any material capable of being etched to make a hard mask. In some embodiments, hard mask layer 365 is formed of amorphous Silicon (a-Si). As hard mask layer 365 is used to define a post being formed and will eventually be stripped away, it can include substantial defects. Because of this insensitivity to defects, hard mask layer 365 may be formed using any formation process known in the art including, but not limited to, various CVD processes without significant regard for the propensity of the selected process to result in defects. As shown in a cross sectional view 303 of FIG. 3d, hard mask layer 365 is patterned using standard photo-resist based photolithography to leave post shape patterns 370a, 370b. Post shape patterns 370a, 370b form a hard mask outlining the location and shape of posts to be formed.

Figure 3E:
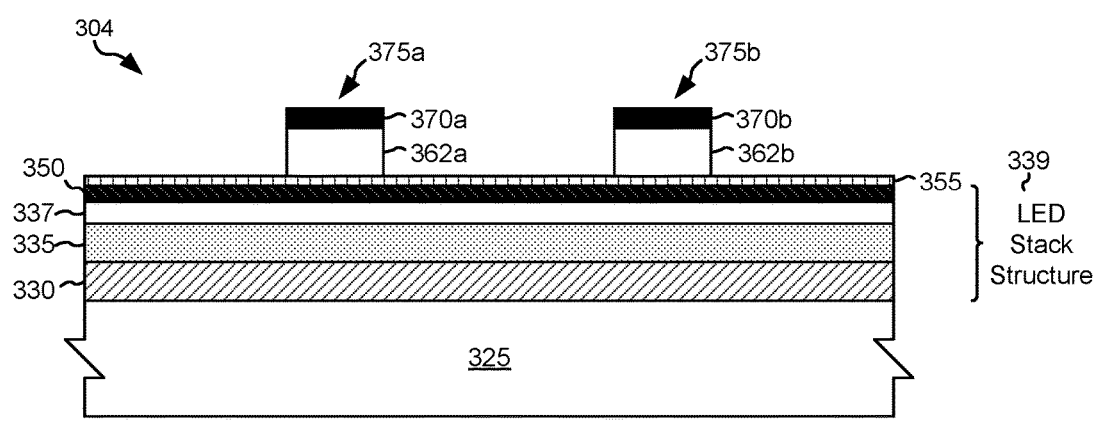
Figure 3F:
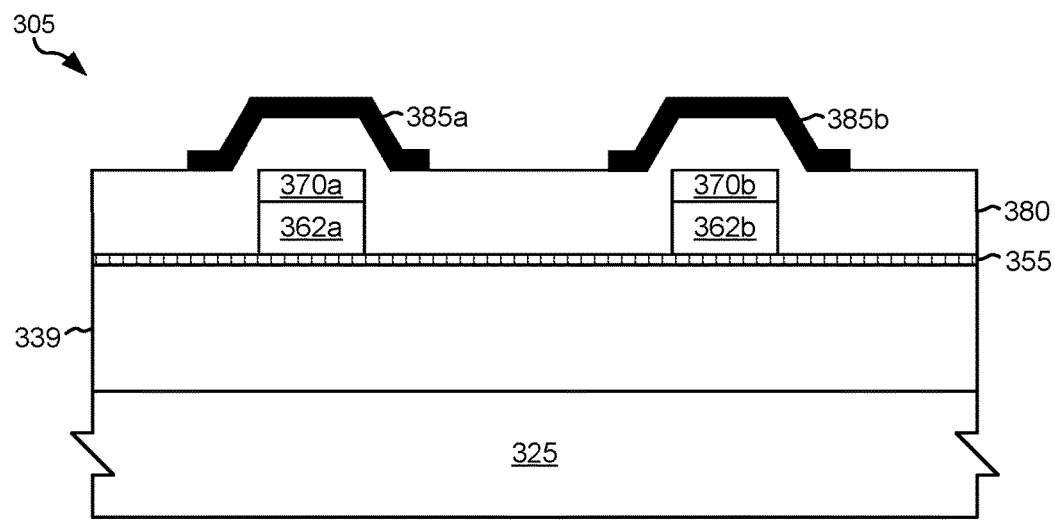

Using the hard mask as a guide, post layer 360 is etched as shown in a cross sectional view 304 of FIG. 3e. As shown, a portion 375a of post layer 360 remains as post 362a with a post shape pattern 370a in top and another portion 375b of post layer 360 remains as post 362b with a post shape pattern 370b on top. In some embodiments, the etch that exposes portions 375 is a reactive ion etch (RIE). Turning to FIG. 3f, an oxide layer 380 is formed over portions 375. In some cases, oxide layer 380 is made of $SiO_2$, but other oxides known in the art may be used. The thickness of oxide layer 380 is at least the thickness of post 362a up to a thickness slightly greater than the thickness of portions 375. Oxide layer 380 may be formed using, for example, a CVD process. Based upon the disclosure provided herein, one of ordinary skill in the art will recognize other processes that may be used to form oxide layer 380.

Figure 3G:
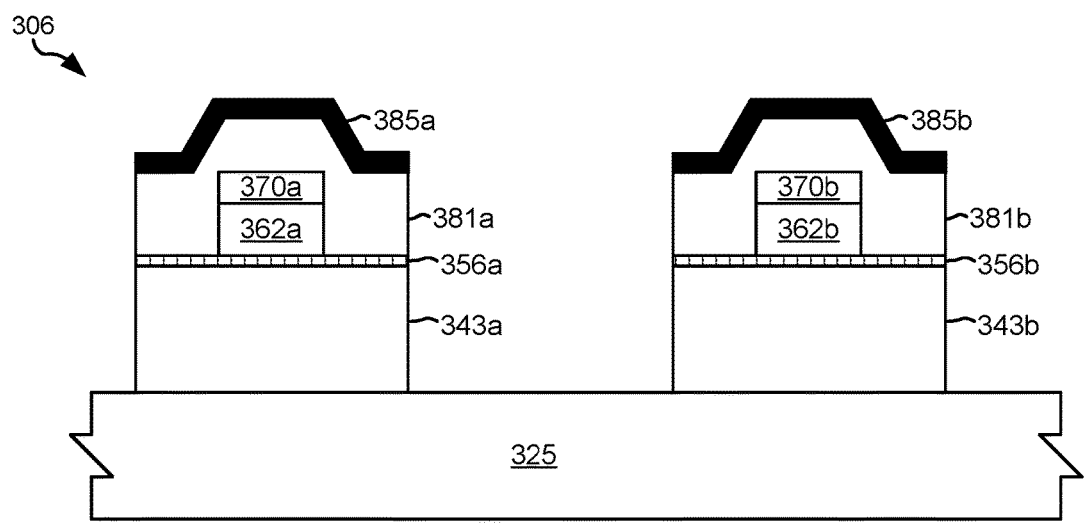

Next, as shown in cross sectional view 305 of FIG. 3f, a photoresist layer is formed over oxide layer 380 and patterned to yield disk shape patterns 385a, 385b. Any process for applying and patterning a photoresist may be used in relation to different embodiments. The size of disk shape patterns 385 define the width of the diode structures (e.g., Wd shown in FIG. 2c). Turning to FIG. 3g, as shown in a cross sectional view 306, an etch is performed using disk shape patterns 385 as a guide with the etch continuing through: oxide layer 380 leaving portions 381 under respective disk shape patterns 385, current spreading layer 355 leaving portions 356 under respective disk shape patterns 385, and LED stack structure 339 leaving diode structures 343 under respective disk shape patterns 385. Oxide layer 380 under respective disk shape patterns 385 acts as a hard mask during the etch of the successive layers of LED stack structure 339.

Figure 3H:
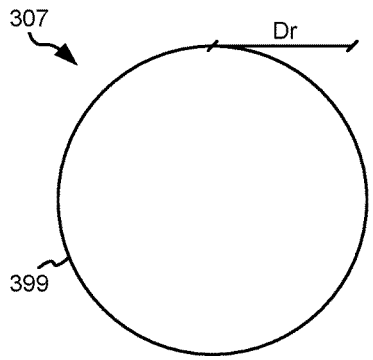
Figure 3I:
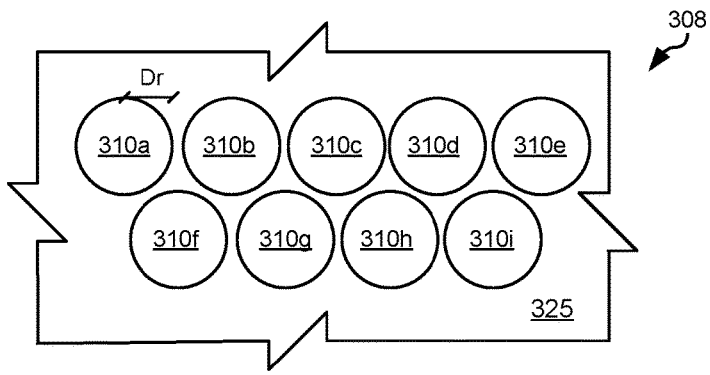
Figure 3J:
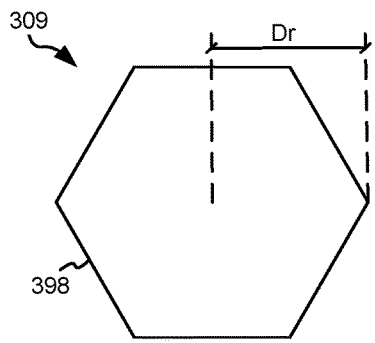
Figure 3K:
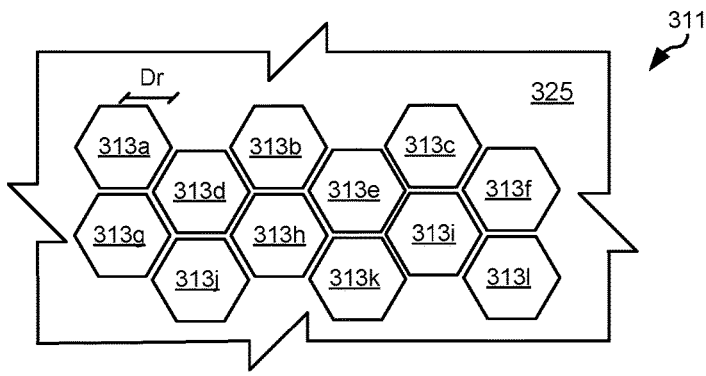

Turning to FIG. 3h, a top diagram 307 shows a circular shape 399 of the diode structure with a radius (Dr) that results where disk shape patterns 385 are formed as circular shapes followed by the etching process discussed above in relation to FIG. 3g. Turning to FIG. 3i, a top diagram 308 shows a number of circular shaped diode structures 310 formed by the etching process discussed in relation to FIG. 3g. Such a circular shape results in considerable waste of LED wafer stack 341. To mitigate the waste resulting from circular shapes, other embodiments utilize a hexagonal shape 398 as shown in a top diagram 309 of FIG. 3j. Hexagonal shapes 398 include a maximum distance from point to point of 2*Dr making such disks compatible with wells capable of holding the circular shape of the same size (i.e., having a diameter of 2*Dr). Turning to FIG. 3k, a top diagram 311 shows a number of hexagonal shaped diode structures 313 formed by the etching process discussed in relation to FIG. 3g using hexagon shaped disk shape patterns 385. As shown, such a hexagonal shape mitigates much of the waste of LED wafer stack 341 resulting where circular disk shape patterns are used. Further, variance in the etch process is reduced due to the consistent distances between hexagonal shaped diode structures 313 as compared to the variable distances between circular shaped diode structures 313.

Figure 3L:
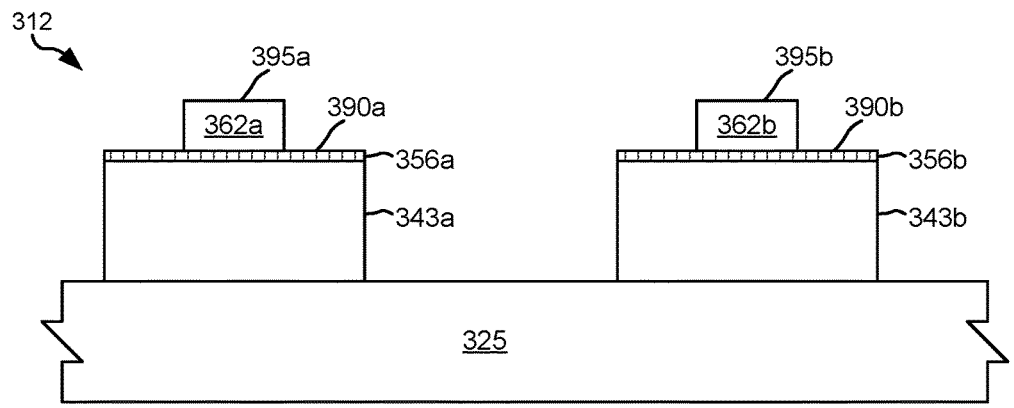

After the etch discussed in relation to 3g exposes the edges of the diode structures, the photoresist included in disk shape patterns 385 is stripped using any photoresist stripping process known in the art, and a subsequent etch of portions 381 of oxide layer 380 that were previously protected by disk shape patterns 385 is etched leaving post shape patterns 370 on top of respective posts 362. During this etch, post shape patterns 370 act as a hard mask protecting respective posts 362. Once the etch of portions 381 is complete, post shape patterns 370 are stripped using any process known in the art for selectively removing the material of post shape patterns 370 without disturbing posts 362. At this juncture, posts 362 extend from a surface 390 of diode structures 343 to a top post surface 395 as shown in a cross sectional view 312 of FIG. 3l. A region of surface 390 not under post 362 is available for making an electrical contact to a given diode structure 343.

Figure 3M:
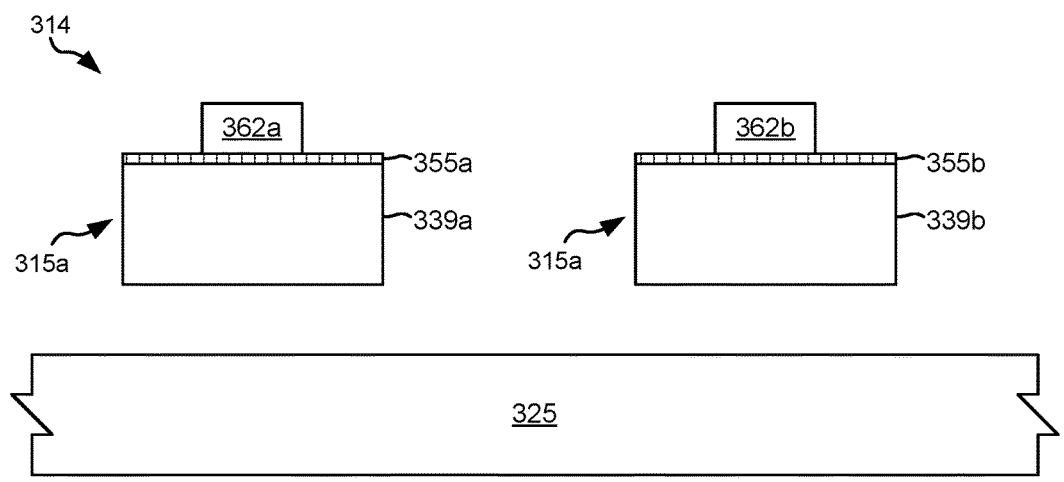

Turning to FIG. 3m, a cross sectional view 314 shows the result of a separation process applied to remove post enhanced diodes 315 from substrate 325. In some embodiments, the separation process is a laser lift off process. Such laser lift off may be used, for example, where the substrate is sapphire. In other embodiments, a chemical undercutting may be used to perform the separation process. Such chemical undercut separation may be used, for example, where the substrate is silicon using an $XeF_2$ or wet etch. Based upon the disclosure provided herein, one of ordinary skill in the art will recognize a variety of processes that may be used to separate post enhanced diodes 315 from substrate 325 in accordance with different embodiments. It should be noted that while the process discussed above in relation to FIGS. 3a-3m shows a post being formed on the center of a diode structure, other embodiments will result in a post being formed off center on the diode structure. Further, it should be noted that while circular shaped and hexagonal shaped diode structures have been specifically discussed, that other shapes may be used in relation to different embodiments.

It should be noted that alternative approaches to the aforementioned manufacturing processes may be used in relation to different embodiments. For example, forming the first hard mask defining the shape of the posts may include, but is not limited to, conformally depositing an etch stop layer overlying post material 360, and conformally depositing a masking layer overlying the aforementioned hard mask layer. The masking layer may be, for example, a photoresist layer. The masking layer is patterned to defined the shape of the posts and expose regions of the hard mask layer. The hard mask layer is then etched using the post shapes in the masking layer as a guide to expose regions of the etch stop, and then etching the etch stop to expose regions of the post material. Another hard mask defining the shape of the diode structures may include, but is not limited to, conformally depositing a second hard mask layer overlying the post 362 and a portion of a top surface of current spreading layer 355, and conformally depositing a second masking layer overlying the second hard mask layer. The second masking layer may be, for example, a photoresist layer. The second masking layer is patterned to defined the shape of the diode structure. The second hard mask layer, the current spreading layer and the diode stack structure are etched using the patterned second masking layer as a guide. Next, the remaining portions of the second hard mask and the first hard mask are removed to yield expose the post enhanced diode. The aforementioned hard mask layers may be made of, for example, TEOS, PECVD Silicon Nitride (SiN), nickel, or chrome. The etch stop material may be amorphous silicon, and the post material may be, for example, a dielectric film, TEOS, conductive metal, silicon dioxide or PECVD Silicon Nitride (SiN).

As yet another alternative to the manufacturing process discussed above in relation to FIGS. 3a-3m, the diode structure may be defined by patterning and etching before forming the post over the diode structure. Such a process is more fully discussed below in relation to FIG. 6. Such formation of the post on an already formed diode structure in some cases may be used to form a conductive post that operates as an electrical contact for the diode structure, but may also be used to form non-conductive posts.

Turning to FIG. 4, a portion 400 of a display or other device including a number of wells 410 formed into a substrate 405, and each able to accept a post enhanced diode is shown in accordance some embodiments. Of note, the diameter of each of wells 410 is 2*(Dr+De) where De is greater than zero. Such a diameter is large enough to accept any of circular, hexagonal or other polygonal shaped post enhanced diodes exhibiting a maximum cross sectional width of 2*Dr.

Figure 5:
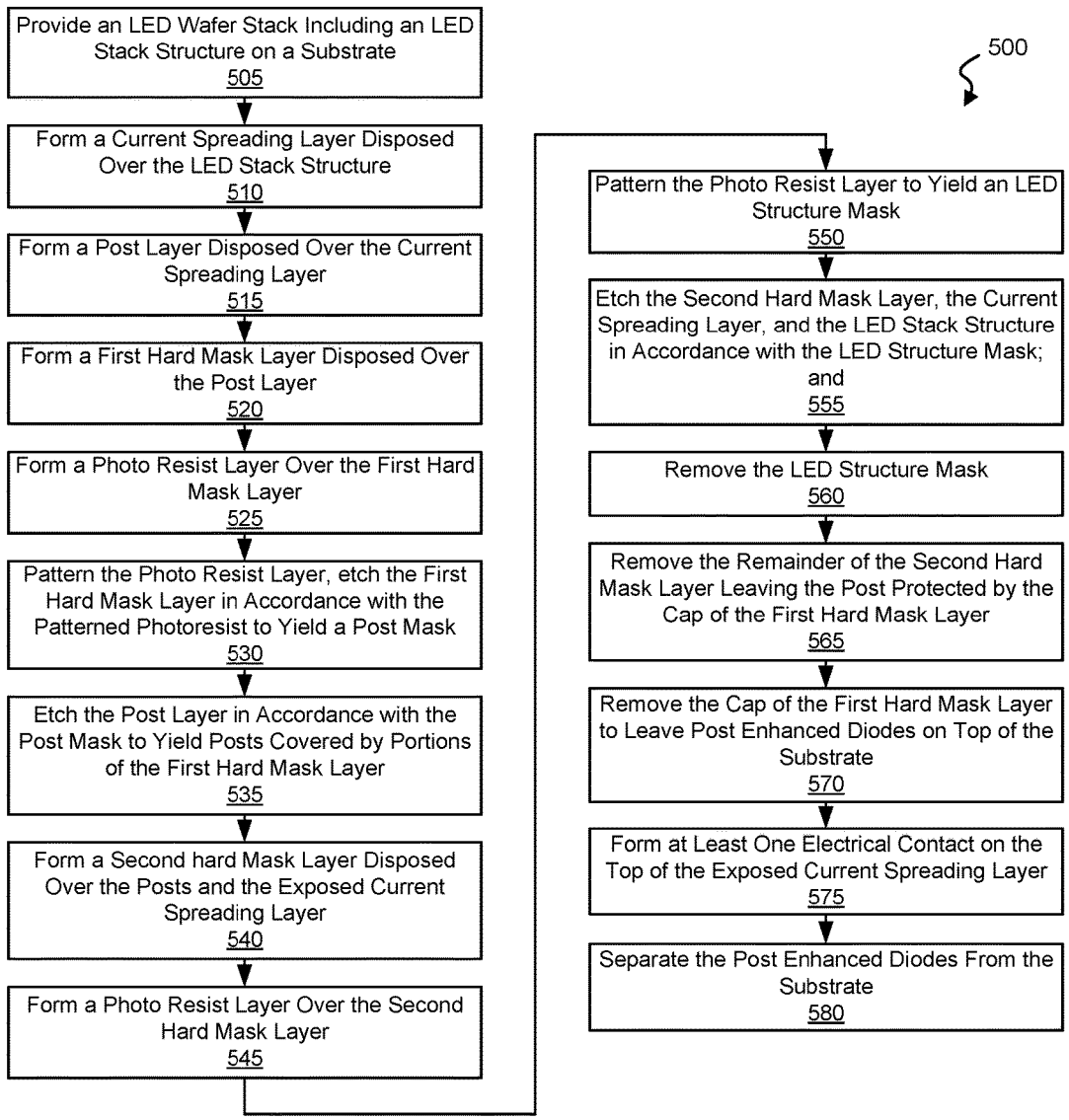
FIG. 5 is a flow diagram depicting a method for manufacturing a post enhanced diode in accordance with some embodiments of the present inventions.

Turning to FIG. 5, a flow diagram 500 shows a method for manufacturing a post enhanced diode in accordance with some embodiments of the present inventions. Following flow diagram 500, an LED wafer stack is provided that includes an LED stack structure on a substrate (block 505). In some embodiments, the substrate is $Al_2O_3$ material. Based upon the disclosure provided herein, one of ordinary skill in the art will recognize other materials that may be used for substrate including, but not limited to, silicon. Any LED stack structure known in the art may be used. In some embodiments, the LED stack structure disposed on top of the substrate includes a first layer disposed on the substrate, a second layer disposed on the first layer, an MQW disposed on the second layer, and a third layer disposed on the MQW.

In the case of a blue LED, the first layer of the LED stack structure may be u-GaN, the second layer is n-GaN, the MQW includes alternating layers of InGaN and GaN, and a transition layer p-AlGaN on top of the aforementioned alternating layers, and the third layer is p-GaN. In one particular embodiment, the substrate is approximately 430 µm thick, the first layer is approximately 2 µm thick, the second layer is approximately 2.5 µm thick, the alternating layers of the MQW are approximately 0.2 µm thick, the transition layer of the MQW is approximately 0.08 µm thick, and the third layer is approximately 0.2 µm thick. Based upon the disclosure provided herein, one of ordinary skill in the art will recognize other materials and thicknesses that may be used in relation to the different layers of the LED wafer stack to create different types of light emitting diodes.

A current spreading layer is formed on top of the LED stack structure (block 510). In one embodiment where the top layer of the LED stack structure is p-GaN, the current spreading layer is a stack of nickel oxide and ITO with a thickness between 20 nm and 100 nm. In some embodiments, the current spreading layer is formed on top of the LED wafer stack using a sputtering process. In other embodiments, the current spreading layer is formed on top of the LED wafer stack using a pyrolysis process. Based upon the disclosure provided herein, one of ordinary skill in the art will recognize other processes that may be used to form the current spreading layer.

A post layer is formed over the current spreading layer (block 515). The thickness of the post layer is varied depending upon the height of the post to be formed on top of the diode structure (e.g., the height of post 255 (Hp) formed on top of diode structure 285). The post layer may be a thick film such as, for example, $SiO_2$. In some embodiments, the post layer may be formed using a CVD process. Based upon the disclosure provided herein, one of ordinary skill in the art will recognize other processes that may be used to form the post layer.

A first hard mask layer is formed over the post layer (block 520). The first hard mask layer may be formed of any material capable of being etched to make a hard mask. In some embodiments, the hard mask layer is formed of a-Si. As the hard mask layer is used to define a post being formed, and will eventually be stripped away, it can include substantial defects. Because of this insensitivity to defects, the hard mask layer may be formed using any formation process known in the art including, but not limited to, various CVD processes without significant regard for the propensity of the selected process to result in defects.

A photoresist layer is formed over the first hard mask layer (block 525), and the photoresist is patterned, the hard mask layer is etched using the patterned photoresist, and the remaining photoresist is stripped to yield a post mask (block 530). The post mask leaves portions of the hard mask in the shape of posts. Using the first hard mask as a guide, the post layer is etched to remove portions not covered by the post mask (block 535). This etch leaves posts capped by respective portions of the post masks on top of the current spreading layer. In some embodiments, the etch is an RIE.

A second hard mask is formed over the capped posts and the exposed current spreading layer (block 540). In some embodiments, the second hard mask is an oxide layer that may be made, for example, from $SiO_2$. The thickness of the second hard mask is at least the thickness of the post layer up to a thickness slightly greater than the thickness of the capped posts. The second hard mask may be formed using, for example, a CVD process. Based upon the disclosure provided herein, one of ordinary skill in the art will recognize other processes that may be used to form the second hard mask.

A photoresist layer is formed over the second hard mask layer (block 545), and the photoresist is patterned to form an LED structure mask that defines the sizes and shapes of the diode structures of the post enhanced diodes being manufactured (block 550). In some cases, the LED structure mask defines circular diode structures. In other cases, the LED structure mask defines hexagonal diode structures each patterned equidistant from one another. Other shapes may also be used in accordance with other embodiments.

Next, an etch is performed using the LED structure mask to etch through the second hard mask, the current spreading layer, and the layers of the LED stack structure to expose the underlying substrate (block 555). This etch yields the overall shape of the LED diode structure while leaving the corresponding post and cap of the first hard mask encased in the second hard mask under the LED structure mask. The LED structure mask is stripped (block 560).

The cap of the first hard mask on top of each of the posts protects the posts as the remainder of the second hard mask encasing the posts is removed (block 565). The cap of the first hard mask on top of each of the posts is then selectively etched leaving the post layer exposed at a top surface (block 570). At some point after the current spreading layer is re-exposed by stripping the remainder of the second hard mask layer (after block 565), at least one electrical contact is formed on top of the exposed current spreading layer (block 575). Such an electrical contact may be formed using any contact forming process and/or material known in the art. In some cases, the electrical contact is simply the exposed current spreading layer. At this juncture, post enhanced diodes have been formed, but remain attached to the substrate. A separation process is performed to separate the post enhanced diodes from the substrate (block 580). In some cases, the separation process is a laser lift off process.

Figure 6:
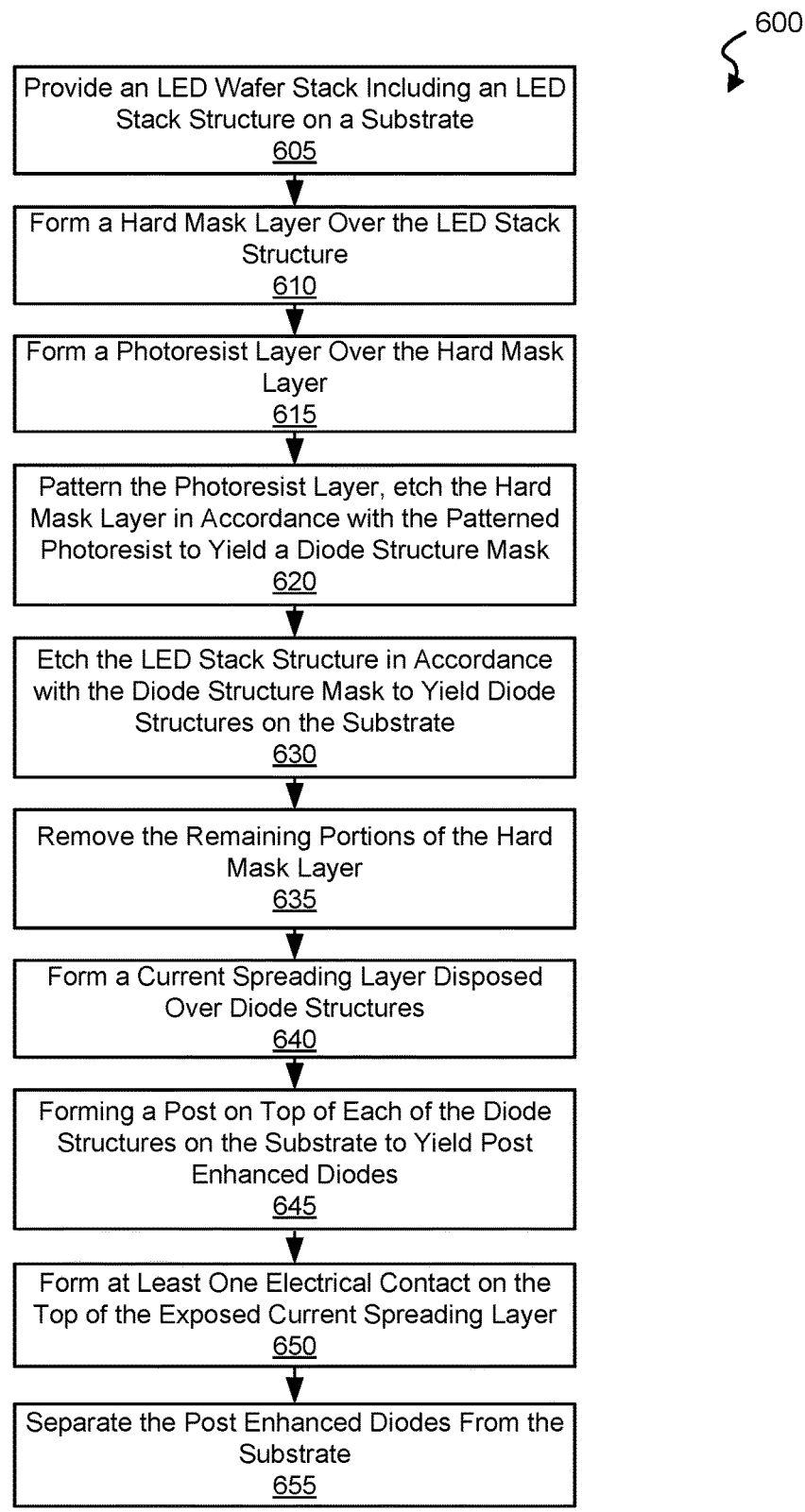
FIG. 6 is a flow diagram depicting a method for manufacturing a post enhanced diode in accordance with other embodiments of the present inventions.

Turning to FIG. 6, a flow diagram 600 shows a method for manufacturing a post enhanced diode in accordance with other embodiments of the present inventions. Following flow diagram 600, an LED wafer stack is provided that includes an LED stack structure on a substrate (block 605). In some embodiments, the substrate is $Al_2O_3$ material. Based upon the disclosure provided herein, one of ordinary skill in the art will recognize other materials that may be used for substrate including, but not limited to, silicon. Any LED stack structure known in the art may be used. In some embodiments, the LED stack structure disposed on top of the substrate includes a first layer disposed on the substrate, a second layer disposed on the first layer, an MQW disposed on the second layer, and a third layer disposed on the MQW.

In the case of a blue LED, the first layer of the LED stack structure may be u-GaN, the second layer is n-GaN, the MQW includes alternating layers of InGaN and GaN, and a transition layer p-AlGaN on top of the aforementioned alternating layers, and the third layer is p-GaN. In one particular embodiment, the substrate is approximately 430 µm thick, the first layer is approximately 2 µm thick, the second layer is approximately 2.5 µm thick, the alternating layers of the MQW are approximately 0.2 µm thick, the transition layer of the MQW is approximately 0.08 µm thick, and the third layer is approximately 0.2 µm thick. Based upon the disclosure provided herein, one of ordinary skill in the art will recognize other materials and thicknesses that may be used in relation to the different layers of the LED wafer stack to create different types of light emitting diodes.

A current spreading layer is formed on top of the LED stack structure (block 610). In one embodiment where the top layer of the LED stack structure is p-GaN, the current spreading layer is a stack of nickel oxide and ITO with a thickness between 20 nm and 100 nm. In some embodiments, the current spreading layer is formed on top of the LED wafer stack using a sputtering process. In other embodiments, the current spreading layer is formed on top of the LED wafer stack using a pyrolysis process. Based upon the disclosure provided herein, one of ordinary skill in the art will recognize other processes that may be used to form the current spreading layer including, but not limited to, sputtering.

A hard mask layer is formed over the current spreading layer (block 615), a photoresist layer is formed over the hard mask layer (block 620). The photoresist layer is patterned and the hard mask layer is etched in accordance with the patterned photoresist to yield a diode structure mask (block 625). The diode structure mask includes portions of the hard mask layer over the LED stack structure defining the location and shape of diode structures to be formed in the LED stack structure. The LED stack structure is etched through to the substrate using the diode structure mask to yield diode structures on top of the substrate (block 630). The remaining portions of the hard mask layer are then removed (block 635).

With the diode structures formed, at least one post is formed on top of each of the diode structures (block 645). In some embodiments, forming the post may include: depositing a post material; conformally depositing a second etch stop layer overlying a top surface of the diode structure; conformally depositing a second hard mask layer overlying the second etch stop layer; conformally depositing a third masking layer overlying the second hard mask layer; patterning the third masking layer to define a post shape; etching exposed regions of the third hard mask layer; and etching exposed regions of the second etch stop layer to form the post. In other embodiments, forming the post may include depositing a conductive metal or other conductive post material, and forming the conductive metal or other conductive post material into a post capable of operating as an electrical contact for the post enhanced diode.

At some point after the diode structures are formed (after block 635), at least one electrical contact is formed on top of the exposed current spreading layer (block 645). Such an electrical contact may be formed using any contact forming process and/or material known in the art. In some cases, the electrical contact is simply the exposed current spreading layer. At this juncture, post enhanced diodes have been formed, but remain attached to the substrate. A separation process is performed to separate the post enhanced diodes from the substrate (block 650). In some cases, the separation process is a laser lift off process.

One of ordinary skill in the art will recognize various advantages achievable through use of different embodiments of the inventions. As just some of many advantages, lower display costs are possible as a significant cost of manufacturing a microLED display is the material cost of the microLEDs themselves. As some embodiments of the present inventions allow for reducing redundancy otherwise necessary to assure an operable display, the overall number of microLEDs may be reduced resulting in a corresponding reduction in costs. Various embodiments of the present inventions do not require lock-n-key type interaction between post enhanced diodes and wells which allow diodes to deposit in only a single orientation. As such, manufacturing tolerances may be reduced leading to greater yields and/or lower costs. Based upon the disclosure provided herein, one of ordinary skill in the art will recognize a variety of other advantages achievable through use of one or more embodiments of the present inventions.

In conclusion, the invention provides novel systems, devices, methods and arrangements for fluidic assembly. While detailed descriptions of one or more embodiments of the invention have been given above, various alternatives, modifications, and equivalents will be apparent to those skilled in the art without varying from the spirit of the invention. For examples, while some embodiments are discussed in relation to displays, it is noted that the embodiments find applicability to devices other than displays. Therefore, the above description should not be taken as limiting the scope of the invention, which is defined by the appended claims.

What is claimed is:

1. A method for manufacturing a post enhanced diode, the method comprising:
   providing a diode stack structure including an n-doped semiconductor layer and a p-doped semiconductor layer; and
   forming a post disposed over the diode stack structure, wherein forming the post disposed over the diode stack structure includes:
      forming a post material disposed over the diode stack structure, wherein a thickness of the post material defines a height of the post;
      forming a hard mask disposed over the post material to define a width of the post, wherein forming the hard mask includes:
         depositing an etch stop layer overlying the post material;
         depositing a hard mask layer over the etch stop layer;
         depositing a masking layer overlying the hard mask layer;
         patterning the masking layer to define a post shape and exposing regions of the hard mask;
         etching the hard mask layer to expose regions of the etch stop; and
         etching the etch stop to expose regions of the post material; and
      etching the post material using the hard mask as a guide to define the post.

2. The method of claim 1, the method further comprising:
   forming a current spreading layer on the diode stack structure, wherein the current spreading layer is between the post and the diode stack structure.

3. The method of claim 2, wherein forming the post comprises:
   depositing conductive metal post material overlying the current spreading layer; and
   forming the post as an electrical contact for the post enhanced diode.

4. The method of claim 2, wherein forming the post comprises:
   selectively plating a conductive metal post material overlying the current spreading layer; and
   forming the post as an electrical contact for the post enhanced diode.

5. The method of claim 1, wherein the diode stack structure is a light emitting diode stack structure having an anode and a cathode.

6. The method of claim 1, wherein the post is made of Silicon Dioxide, and wherein the hard mask is made of amorphous Silicon.

7. The method of claim 1, wherein the hard mask is a first hard mask, and wherein forming the post disposed over the diode stack structure further comprises:
   forming a second hard mask encasing the post, wherein the second hard mask defines a width of a diode structure; and
   etching the diode stack structure using the second hard mask as a guide to define the diode structure.

8. The method of claim 7, wherein the post is made of a first material, wherein the first hard mask is made of a second material, and wherein the second hard mask is made of the first material.

9. The method of claim 7, wherein the etch stop layer is a first etch stop layer, wherein the hard mask layer is a first hard mask layer, wherein the masking layer is a first masking layer, wherein the method further comprises forming a current spreading layer on the diode stack structure, wherein the current spreading layer is between the post and the diode stack structure; and wherein forming the second hard mask encasing the post comprises:
conformally depositing a second hard mask layer overlying the post and a portion of a top surface of the current spreading layer;
conformally depositing a second masking layer overlying the second hard mask layer;
patterning the second masking layer to define a shape of the diode structure;
etching the second hard mask layer, the current spreading layer, and the diode stack structure;
removing the second hard mask and the first hard mask to yield expose the post enhanced diode.

10. The method of claim 9, wherein the diode stack structure is attached to a substrate, the method further comprising:
separating the post enhanced diode from the substrate.

11. The method of claim 10, the method further comprising:
forming at least one electrical contact on an exposed portion of the current spreading layer prior to separating the post enhanced diode from the substrate.

12. The method of claim 9, wherein the first hard mask and the second hard mask are made of a material selected from a group consisting of: tetraethyl orthosilicate (TEOS), nickel, and chrome; wherein the first etch stop material is amorphous silicon, and wherein the post material is selected from a group consisting of: a dielectric film, TEOS, conductive metal, and silicon dioxide.

13. The method of claim 9, wherein the shape of the diode structure is selected from a group consisting of: a circle, and a polygon.

14. The method of claim 1, wherein a bottom layer of the diode stack structure opposite a top layer over which the post is disposed operates as an electrical contact.

15. The method of claim 1, wherein the diode stack structure is formed on top of a substrate, the method further comprising:
forming a hard mask layer over a top surface of the diode stack structure;
conformally depositing a masking layer overlying the hard mask layer;
patterning the masking layer into plate shapes;
etching regions exposed by the hard mask layer down to the substrate to form a diode structure attached to the substrate; and
removing the hard mask layer.

16. The method of claim 15, wherein the hard mask layer is a first hard mask layer, wherein the masking layer is a first masking layer, wherein forming the post disposed over the diode stack structure comprises:
subsequent to forming the diode structure, forming the post material over the diode structure; and
subsequent to forming the post, separating the post enhanced diode from the substrate.

17. The method of claim 16, the method further comprising:
prior to separating the post enhanced diode from the substrate, forming at least one electrical contact on a top surface of the diode structure; and
separating the post enhanced diode from the substrate.

18. The method of claim 15, wherein forming a hard mask layer over a top surface of the diode stack structure includes forming the hard mask layer on a current spreading layer disposed over the top surface of the diode stack structure, and wherein forming the post comprises:
depositing a conductive post material; and
forming the post as an electrical contact for the post enhanced diode.

19. A method for manufacturing a post enhanced diode, the method comprising:
providing a diode stack structure including an n-doped semiconductor layer and a p-doped semiconductor layer;
patterning and etching the diode stack structure to yield a diode structure;
forming a post disposed over the diode structure, wherein the post is formed subsequent to patterning and etching the diode stack structure, wherein a height of the diode stack is less than 3.5 times a height of the post; and
wherein forming the post disposed over the diode stack structure includes:
forming a post material disposed over the diode stack structure, wherein a thickness of the post material defines a height of the post;
forming a hard mask disposed over the post material to define a width of the post, wherein forming the hard mask includes:
depositing an etch stop layer overlying the post material;
depositing a hard mask layer over the etch stop layer;
depositing a masking layer overlying the hard mask layer;
patterning the masking layer to define a post shape and exposing regions of the hard mask;
etching the hard mask layer to expose regions of the etch stop; and
etching the etch stop to expose regions of the post material; and
etching the post material using the hard mask as a guide to define the post.

20. The method of claim 19, wherein the diode stack structure is formed on top of a substrate, the method further comprising:
separating the post enhanced diode from the substrate.

21. The method of claim 19, wherein the post is a non-conductive post.

22. The method of claim 19, wherein the diode stack structure is attached to a substrate, the method further comprising:
separating the post enhanced diode from the substrate.

23. The method of claim 19, wherein the shape of the diode stack structure is selected from a group consisting of: a circle, and a polygon.

24. A method for manufacturing a post enhanced diode, the method comprising:
providing a diode stack structure including an n-doped semiconductor layer and a p-doped semiconductor layer, wherein the diode stack structure is formed over a substrate;
patterning and etching the diode stack structure to yield a diode structure
forming a post disposed over the diode structure, wherein the post is formed before patterning and etching the diode stack structure; wherein forming the post disposed over the diode structure includes:
forming a post material disposed over the diode stack structure, wherein a thickness of the post material defines a height of the post;
forming a hard mask disposed over the post material to define a width of the post, wherein forming the hard mask includes:
depositing an etch stop layer overlying the post material;
depositing a hard mask layer over the etch stop layer;
depositing a masking layer overlying the hard mask layer;
patterning the masking layer to define a post shape and exposing regions of the hard mask;
etching the hard mask layer to expose regions of the etch stop; and
etching the etch stop to expose regions of the post material; and
etching the post material using the hard mask as a guide to define the post; and
subsequent to forming the post, separating the post enhanced diode from the substrate.

25. The method of claim 24, wherein the diode structure is a light emitting diode stack structure having an anode and a cathode.

26. The method of claim 24, wherein the post is made of Silicon Dioxide, and wherein the hard mask is made of amorphous Silicon.

27. A method for manufacturing a post enhanced diode, the method comprising:
providing a diode stack structure including an n-doped semiconductor layer and a p-doped semiconductor layer, wherein the diode stack structure is formed over a substrate;
forming a post disposed over the diode stack structure, wherein forming the post disposed over the diode stack structure includes:
forming a post material disposed over the diode stack structure, wherein a thickness of the post material defines a height of the post;
forming a hard mask disposed over the post material to define a width of the post, wherein forming the hard mask includes:
depositing an etch stop layer overlying the post material;
depositing a hard mask layer over the etch stop layer;
depositing a masking layer overlying the hard mask layer;
patterning the masking layer to define a post shape and exposing regions of the hard mask;
etching the hard mask layer to expose regions of the etch stop; and
etching the etch stop to expose regions of the post material; and
etching the post material using the hard mask as a guide to define the post; and
subsequent to forming the post, separating the post enhanced diode from at least a portion of the substrate.

28. The method of claim 27, wherein the post is non-conductive.

29. The method of claim 27, wherein the post is made of Silicon Dioxide, and wherein the hard mask is made of amorphous Silicon.

30. The method of claim 27, wherein the hard mask is a first hard mask, and wherein forming the post disposed over the diode stack structure further comprises:
forming a second hard mask encasing the post, wherein the second hard mask defines a width of a diode structure; and
etching the diode stack structure using the second hard mask as a guide to define the diode structure.

31. The method of claim 30, wherein the post is made of a first material, wherein the first hard mask is made of a second material, and wherein the second hard mask is made of the first material.

32. The method of claim 30, wherein the etch stop layer is a first etch stop layer, wherein the hard mask layer is a first hard mask layer, wherein the masking layer is a first masking layer, wherein the method further comprises forming a current spreading layer on the diode stack structure, wherein the current spreading layer is between the post and the diode stack structure; and wherein forming the second hard mask encasing the post comprises:
conformally depositing a second hard mask layer overlying the post and a portion of a top surface of the current spreading layer;
conformally depositing a second masking layer overlying the second hard mask layer;
patterning the second masking layer to define a shape of the diode structure;
etching the second hard mask layer, the current spreading layer, and the diode stack structure;
removing the second hard mask and the first hard mask to yield expose the post enhanced diode.

33. The method of claim 32, wherein the diode stack structure is attached to a substrate, the method further comprising:
separating the post enhanced diode from the substrate.

34. The method of claim 33, the method further comprising:
forming at least one electrical contact on an exposed portion of the current spreading layer prior to separating the post enhanced diode from the substrate.

35. The method of claim 32, wherein the first hard mask and the second hard mask are made of a material selected from a group consisting of: tetraethyl orthosilicate (TEOS), nickel, and chrome; wherein the first etch stop material is amorphous silicon, and wherein the post material is selected from a group consisting of: a dielectric film, TEOS, conductive metal, and silicon dioxide.

36. The method of claim 32, wherein the shape of the diode structure is selected from a group consisting of: a circle, and a polygon.

* * * * *